(12) United States Patent
Takebuchi et al.

(10) Patent No.: US 8,604,522 B2
(45) Date of Patent: Dec. 10, 2013

(54) FIELD EFFECT TYPE SEMICONDUCTOR DEVICE AND METHOD FOR MANUFACTURING THE SAME

(75) Inventors: Masataka Takebuchi, Kanagawa-ken (JP); Kazuhiro Utsunomiya, Kanagawa-ken (JP); Noriyasu Ikeda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 153 days.

(21) Appl. No.: 13/007,904

(22) Filed: Jan. 17, 2011

(65) Prior Publication Data

US 2011/0175173 A1 Jul. 21, 2011

(30) Foreign Application Priority Data

Jan. 20, 2010 (JP) .................................. 2010-10063

(51) Int. Cl.
*H01L 29/00* (2006.01)

(52) U.S. Cl.
USPC .................... 257/244; 257/903; 257/E21.661

(58) Field of Classification Search
USPC .................... 257/244, 903, E21.661
See application file for complete search history.

(56) References Cited

U.S. PATENT DOCUMENTS 5,777,920 A * 7/1998 Ishigaki et al. ............... 365/154

FOREIGN PATENT DOCUMENTS

| JP | 7-254645 A | 10/1995 |
|---|---|---|
| JP | 08-172187 | 7/1996 |
| JP | 09-270466 | 10/1997 |
| JP | 2000-012836 | 1/2000 |
| JP | 2002-198529 | 7/2002 |
| JP | 2004-172631 | 6/2004 |
| JP | 2004-228592 A | 8/2004 |
| JP | 2007-157913 | 6/2007 |
| JP | 2009-283543 | 12/2009 |

OTHER PUBLICATIONS

Japanese Office Action issued May 31, 2013 in Japanese counterpart Application No. 2010-010063, 4 pages (with English translation, 3 pages).

* cited by examiner

*Primary Examiner* — Howard Weiss
*Assistant Examiner* — Steven Rao
(74) *Attorney, Agent, or Firm* — Patterson & Sheridan, LLP

(57) ABSTRACT

In one embodiment, a semiconductor device includes a well region of a second conductivity type, a control electrode, a first main electrode and a second main electrode. The well region has a source region and a drain region of a first conductivity type selectively formed in a surface of the well region. The control electrode is configured to control a current path between the source region connected to the first main electrode and the drain region connected to the second main electrode. With respect to a reference defined as a position of the well region at an identical depth to a portion of the source region or the drain region with maximum curvature, a peak of impurity concentration distribution of the second conductivity type is in a range of 0.15 micrometers on a side of the surface of the well region and on a side opposite to the surface.

13 Claims, 9 Drawing Sheets

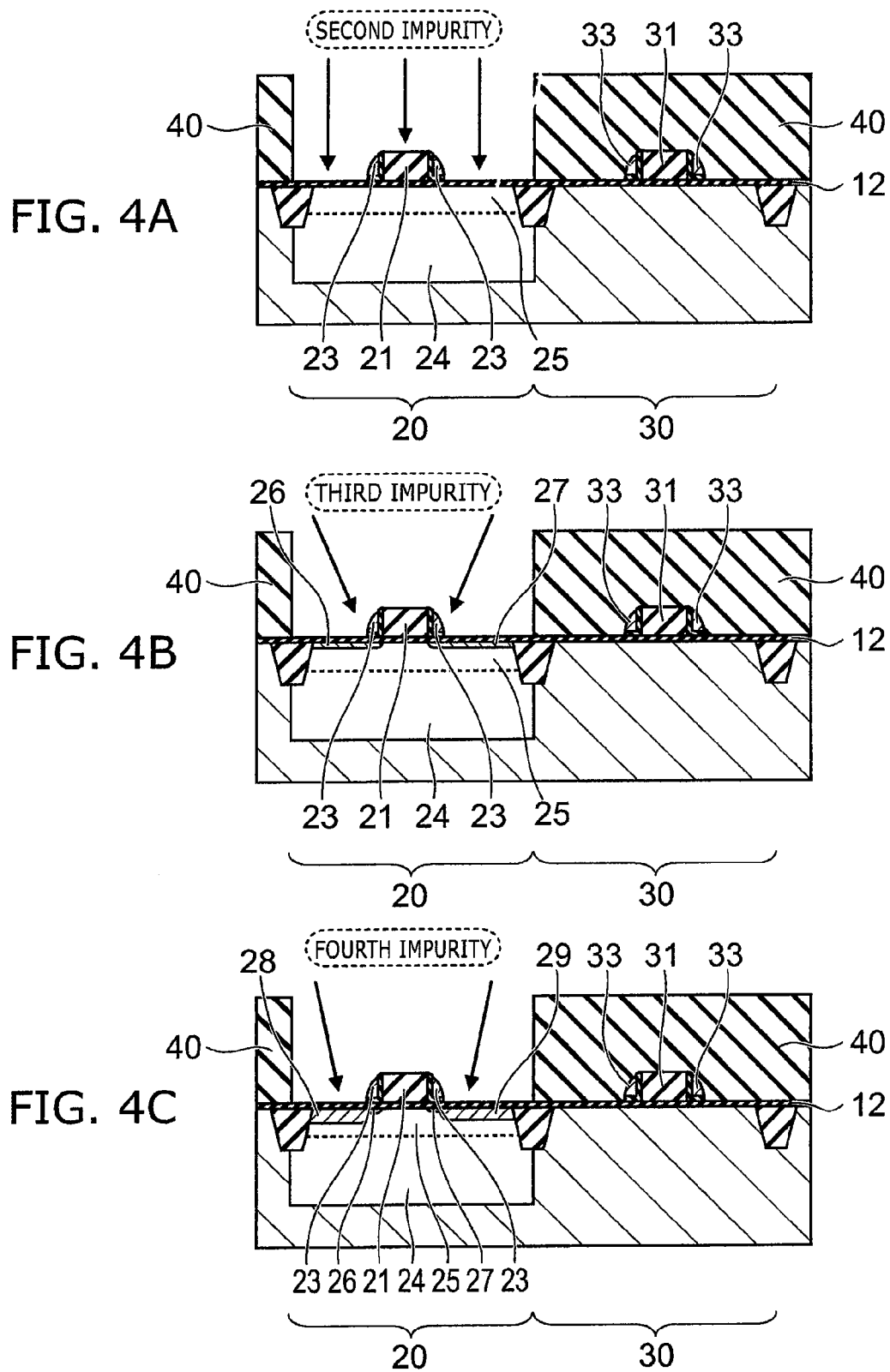

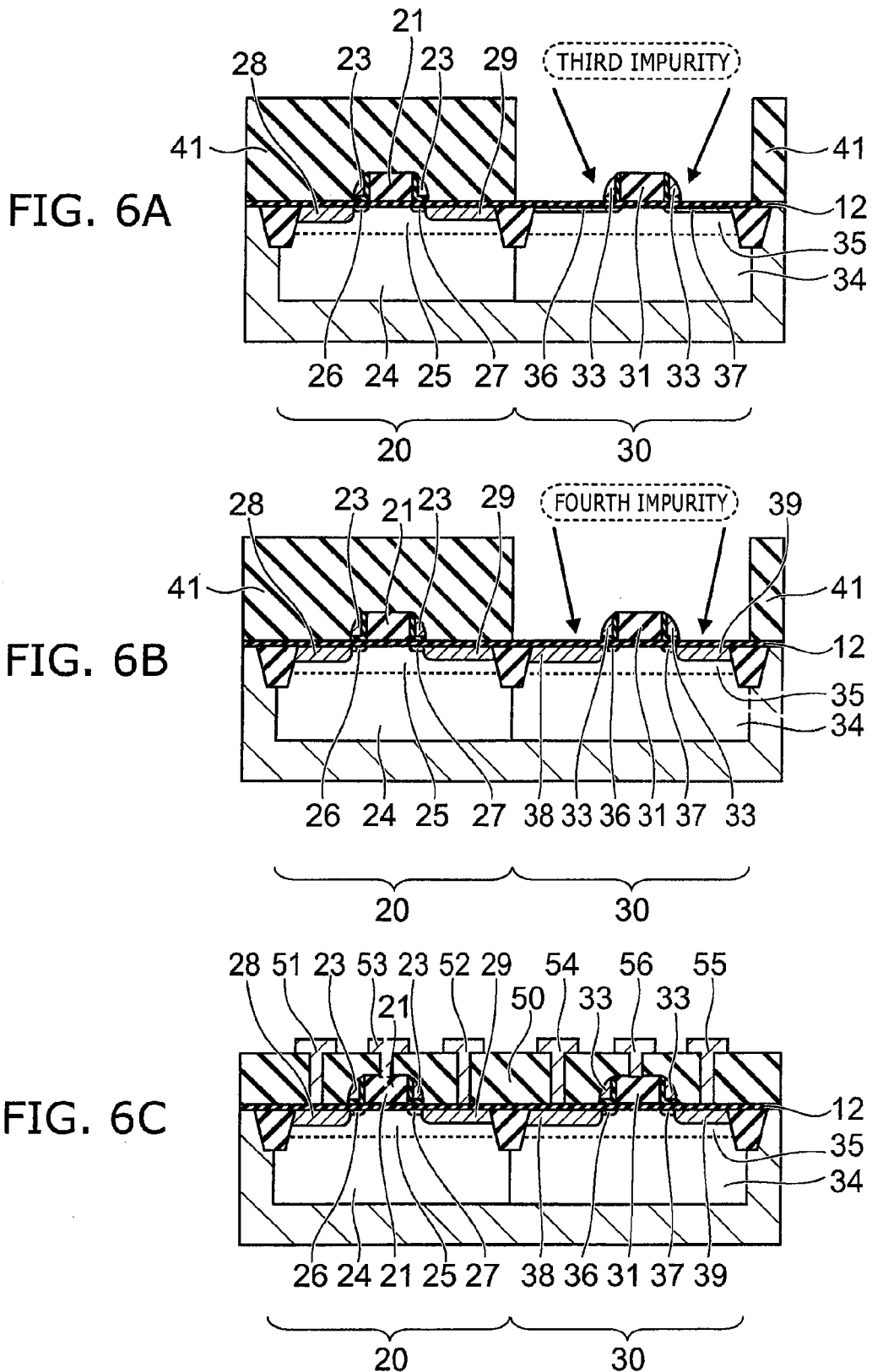

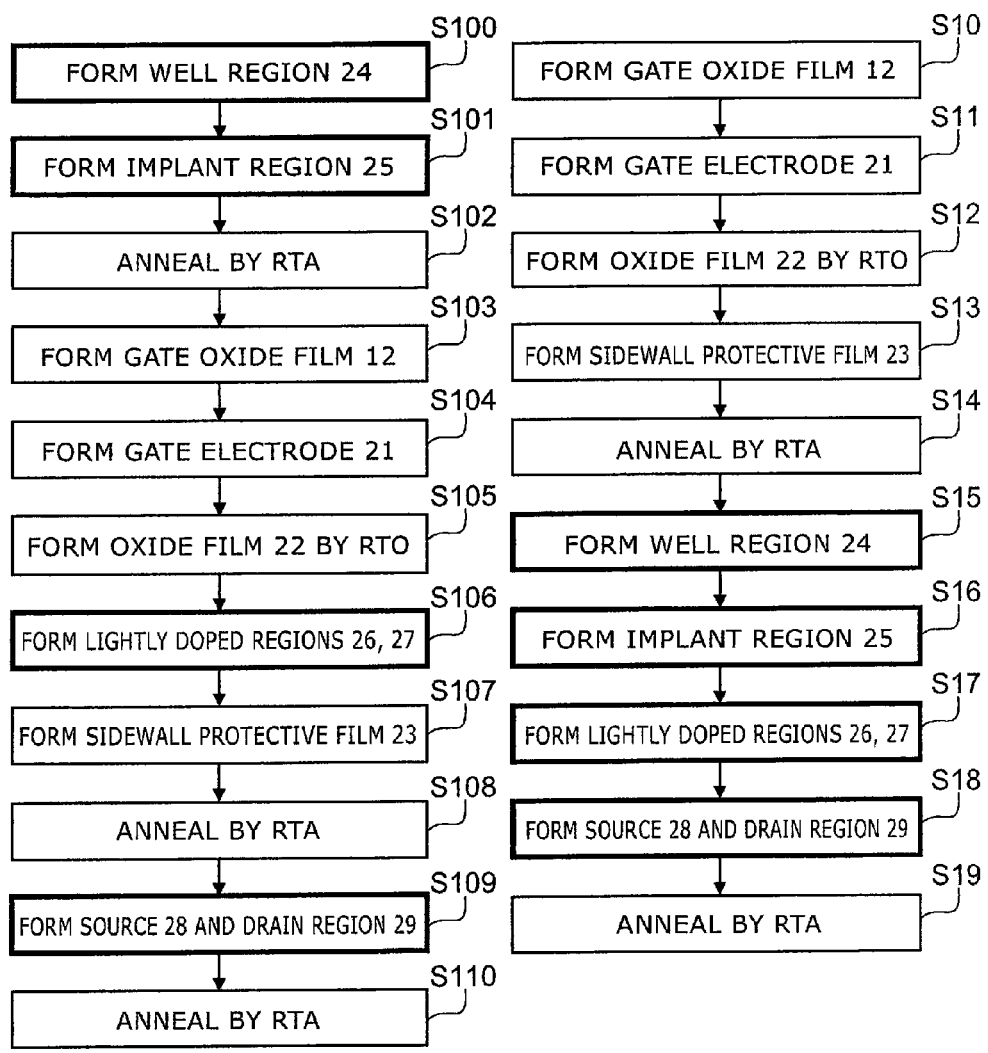

FIELD EFFECT TYPE SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2010-010063, filed on Jan. 20, 2010; the entire contents of which are incorporated herein by reference.

FIELD

Embodiments described herein relate generally to a semiconductor device and a method for manufacturing the same.

BACKGROUND

The process for forming a field effect transistor on the surface of a semiconductor substrate is typically performed as follows. For instance, before forming a gate electrode, impurity is injected into the semiconductor substrate to form a well region of the field effect transistor. In the well region, an implant region for adjusting the threshold voltage (Vt) is further formed. Next, after forming a gate electrode, impurity is injected to form a lightly doped region (lightly doped drain, LDD), a source region, and a drain region (see, e.g., JP-A-2004-228592).

In the manufacturing steps for the respective regions, photolithography is performed typically for each step. Furthermore, heat treatment for diffusing and activating the impurity is also performed for each step. In such manufacturing steps, the number of manufacturing steps cannot be reduced. Furthermore, the impurity concentration distribution in the well region immediately below the gate electrode cannot be sufficiently controlled. Unfortunately, this increases the cost of manufacturing a semiconductor device including a field effect transistor. Furthermore, the short channel effect of the field effect transistor cannot be suppressed.

BRIEF DESCRIPTION OF THE DRAWINGS

FIGS. 4A to 4C are sectional views of the relevant part in the process for manufacturing a semiconductor device according to this embodiment;

FIGS. 6A to 6C are sectional schematic views of the relevant part in the process for manufacturing a semiconductor device according to this embodiment;

FIGS. 7A and 7B illustrate a process flow of a method for manufacturing a semiconductor device subjected to simulation calculation;

DETAILED DESCRIPTION

Figure 1:
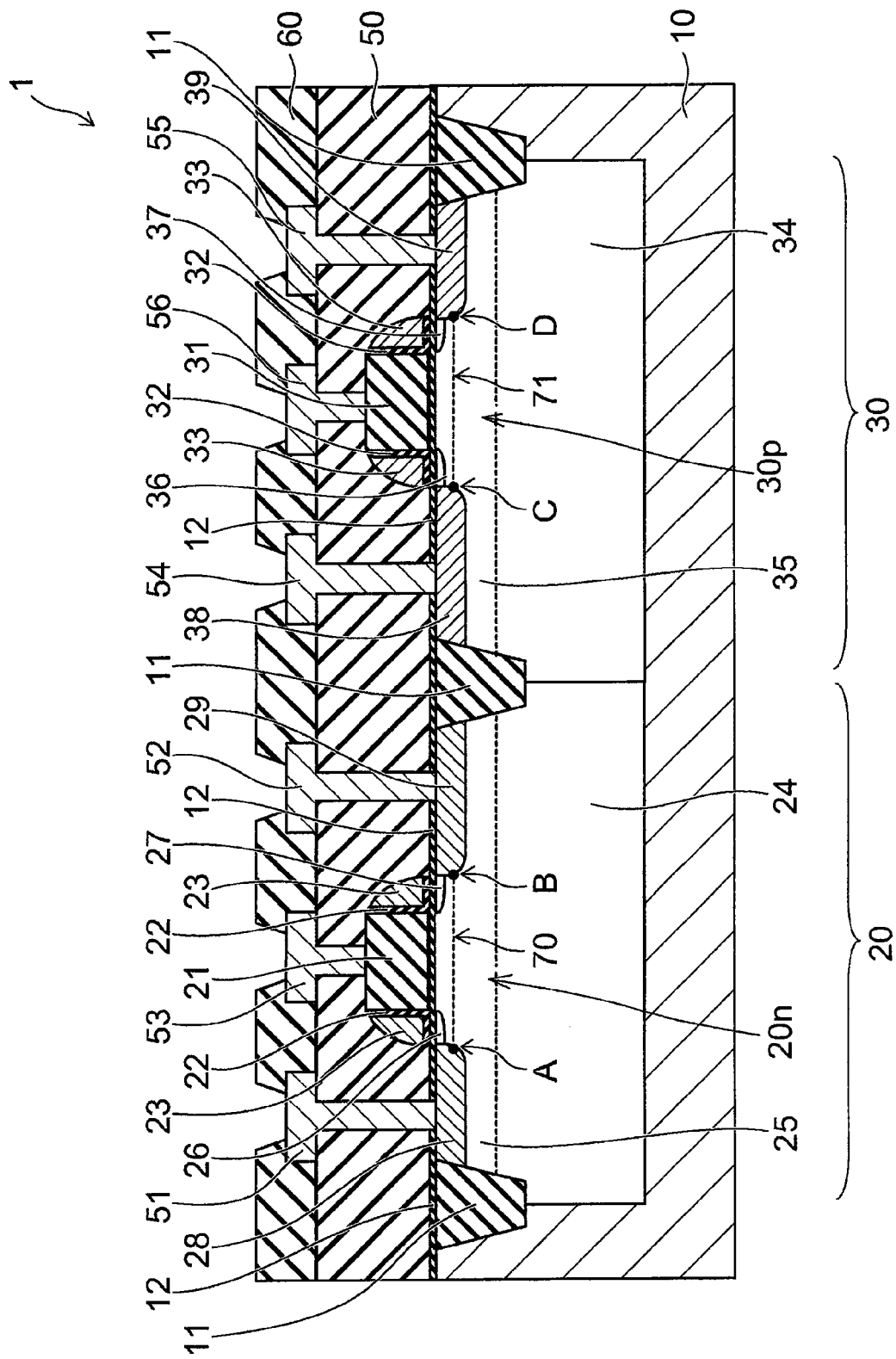
FIG. 1 is a sectional schematic view of the relevant part of a semiconductor device according to an embodiment.

In general, according to one embodiment, a semiconductor device includes a well region of a second conductivity type, a control electrode, a first main electrode and a second main electrode. The well region has a source region of a first conductivity type and a drain region of the first conductivity type selectively formed in a surface of the well region. The control electrode is configured to control a current path between the source region and the drain region. The first main electrode is connected to the source region. The second main electrode is connected to the drain region. With respect to a reference defined as a position of the well region at an identical depth to a portion of the source region with maximum curvature or a portion of the drain region with maximum curvature, a profile of impurity concentration distribution of the second conductivity type in depth direction of the well region has a peak of the impurity concentration distribution in a range of 0.15 micrometers on a side of the surface of the well region and 0.15 micrometers on a side opposite to the surface.

In general, according to one embodiment, a semiconductor device includes a first semiconductor element and a second semiconductor element. The first semiconductor element includes a first well region of a second conductivity type with a first source region of a first conductivity type and a first drain region of the first conductivity type selectively formed in a surface of the first well region, a first control electrode configured to control a current path between the first source region and the first drain region, a first main electrode connected to the first source region, and a second main electrode connected to the first drain region. The second semiconductor element includes a second well region of the first conductivity type with a second source region of the second conductivity type and a second drain region of the second conductivity type selectively formed in a surface of the second well region, a second control electrode configured to control a current path between the second source region and the second drain region, a third main electrode connected to the second source region, and a fourth main electrode connected to the second drain region. With respect to a first reference defined as a position of the first well region at an identical depth to a portion of the first source region with maximum curvature or a portion of the first drain region with maximum curvature, a profile of impurity concentration distribution of the second conductivity type in depth direction of the first well region has a peak of the impurity concentration distribution in a range of 0.15 micrometers on a side of the surface of the first well region and 0.15 micrometers on a side opposite to the surface of the first well region, and with respect to a second reference defined as a position of the second well region at an identical depth to a portion of the second source region with maximum curvature or a portion of the second drain region with maximum curvature, a profile of impurity concentration distribution of the first conductivity type in depth direction of the second well region has a peak of the impurity concentration distribution in a range of 0.15 micrometers on a side of the surface of the second well region and 0.15 micrometers on a side opposite to the surface of the second well region.

In general, according to one embodiment, a method for manufacturing a semiconductor device is disclosed. The method can include forming a control electrode and a sidewall protective film adjacent to a sidewall of the control electrode above a semiconductor layer. The method can include forming a mask pattern having an opening exposing the control electrode and the sidewall protective film. The method can include forming a well region by injecting a first impurity element into the semiconductor layer. The well region contains the first impurity element in the semiconductor layer, which includes below the control electrode. The method can include forming an implant region by injecting a second impurity element into the well region. The implant region contains the second impurity element in the well region, and is configured to adjust a threshold voltage. The method can include forming a first lightly doped region and a second lightly doped region by injecting a third impurity element into a surface of the well region. The first and second lightly doped regions contain the third impurity element in a portion of the surface of the well region below the sidewall protective film. In addition, the method can include selectively forming a source region and a drain region by injecting a fourth impurity element into the surface of the well region. The source region and the drain region contain the fourth impurity element in a portion of the surface of the well region outside the control electrode and the sidewall protective film. With respect to a reference defined as a position of the well region at an identical depth to a portion of the source region with maximum curvature or a portion of the drain region with maximum curvature, the first and the second impurity element are injected so that a peak of a concentration distribution profile of the first and the second impurity element in depth direction of the well region exists in a range of 0.15 micrometers on a side of the surface of the well region and 0.15 micrometers on a side opposite to the surface from the reference.

Embodiments of the invention will now be described with reference to the drawings.

FIG. 1 is a sectional schematic view of the relevant part of a semiconductor device according to an embodiment.

In the semiconductor device 1 according to this embodiment, the semiconductor layer 10 is separated by a device isolation layer 1 into a region 20 including an n-channel type field effect transistor 20n and a region 30 including a p-channel type field effect transistor 30p. The semiconductor device 1 has a CMOS (complementary metal oxide semiconductor) structure including the field effect transistor 20n and the field effect transistor 30p.

First, the configuration of the region 20 is described. In this embodiment, the first conductivity type is n-type, and the second conductivity type is p-type.

In the region 20, a gate electrode 21 as a control electrode is formed above the semiconductor layer 10 via a gate oxide film 12. A sidewall protective film 23 is formed on the sidewall of the gate electrode 21 via an oxide film 22. In the semiconductor layer 10, a p-type well region 24 is formed. The upper portion of the p-type well region 24 constitutes a p-type implant region 25 having lower impurity concentration than the well region 24. The implant region 25 provided in the well region 24 is an impurity-containing region for adjusting the threshold voltage (Vt) of the field effect transistor.

In the surface of the well region 24, an $n^+$-type source region 28 and an $n^+$-type drain region 29 are selectively formed. Furthermore, a lightly doped region (first lightly doped region) 26 adjacent to the source region 28 and a lightly doped region (second lightly doped region) 27 adjacent to the drain region 29 are selectively formed in the surface of the well region 24. The impurity concentration in these n-type lightly doped regions 26, 27 is lower than the impurity concentration in the source region 28 and the drain region 29.

In the region 30, a gate electrode 31 as a control electrode is formed above the semiconductor layer 10 via the gate oxide film 12. The gate electrode 31 controls the current path between the source region 38 and the drain region 39. A sidewall protective film 33 is formed on the sidewall of the gate electrode 31 via an oxide film 32. In the semiconductor layer 10, an n-type well region 34 is formed. The upper portion of the well region 34 constitutes an n-type implant region 35 having lower impurity concentration than the well region 34. The implant region 35 provided in the well region 34 is an impurity-containing region for adjusting the threshold voltage (Vt) of the field effect transistor.

In the surface of the well region 34, a $p^+$-type source region 38 and a $p^+$-type drain region 39 are selectively formed. Furthermore, a lightly doped region (first lightly doped region) 36 adjacent to the source region 38 and a lightly doped region (second lightly doped region) 37 adjacent to the drain region 39 are selectively formed in the surface of the well region 34. The impurity concentration in these p-type lightly doped regions 36, 37 is lower than the impurity concentration in the source region 38 and the drain region 39.

The dashed line 70 shown in the figure is a line by which the portion A of the source region 28 having the maximum curvature on the boundary between the source region 28 and the implant region 25 for adjusting the threshold voltage is connected to the portion B of the drain region 29 having the maximum curvature on the boundary between the implant region 25 and the drain region 29. In the configuration where the shape of the source region 28 is symmetrical to the shape of the drain region 29 about the center of the gate electrode 21, the depth of the dashed line 70 from the surface of the implant region 25 is nearly equal to the depth of the portion A or the portion B.

The dashed line 71 shown in the figure is a line by which the portion C of the source region 38 having the maximum curvature on the boundary between the source region 38 and the implant region 35 for adjusting the threshold voltage is connected to the portion D of the drain region 39 having the maximum curvature on the boundary between the implant region 35 and the drain region 39. In the configuration where the shape of the source region 38 is symmetrical to the shape of the drain region 39 about the center of the gate electrode 31, the depth of the dashed line 71 from the surface of the implant region 35 is nearly equal to the depth of the portion C or the portion D.

The portions A and B are located at a depth of e.g. 0.1-0.3 μm (0.1 micrometers or more and 0.3 micrometers or less) from the interface between the gate oxide film 12 and the implant region 25. Similarly, the portions C, D are located at a depth of e.g. 0.1-0.3 μm from the interface between the gate oxide film 12 and the implant region 35.

Figure 2A:
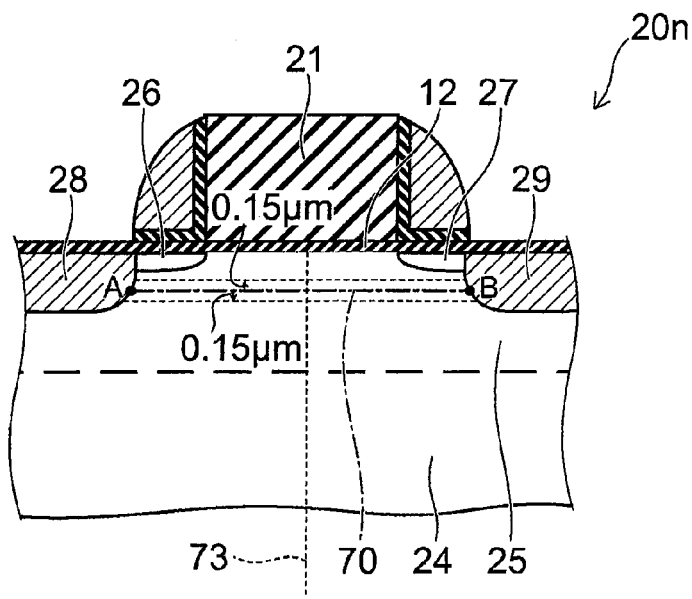
FIGS. 2A and 2B illustrate the semiconductor device according to this embodiment.
Figure 2B:
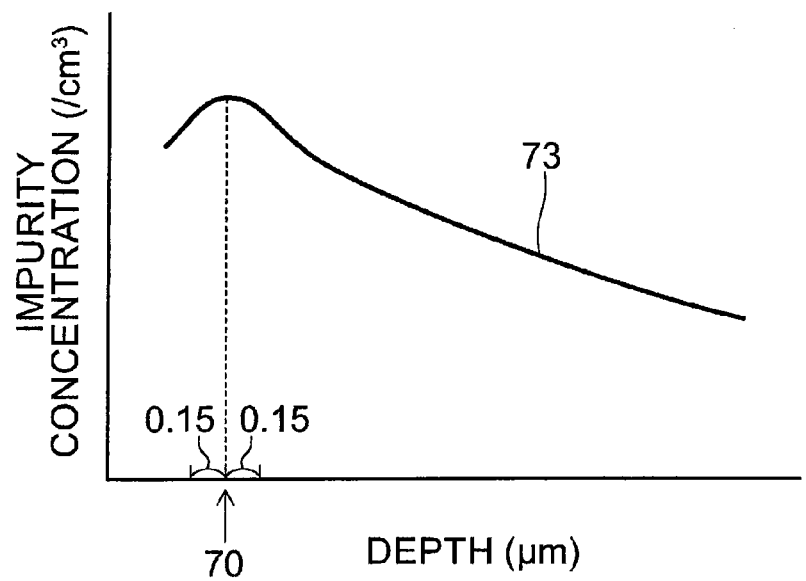

FIGS. 2A and 2B illustrate the semiconductor device according to this embodiment. More specifically, FIG. 2A is an enlarged view of the relevant part of the field effect transistor 20n in FIG. 1, and FIG. 2B shows an impurity concentration distribution profile in the depth direction of the well region 24 on the line 73.

The p-type impurity concentration distribution profile in the depth direction of the well region 24 has a peak of the impurity concentration distribution in the range of ±0.15 micrometers with reference to the position of the well region 24 at the identical depth to the portion A of the source region 28 having the maximum curvature or the portion B of the drain region 29 having the maximum curvature. That is, the peak of the impurity concentration distribution exists in the range of 0.15 micrometers (μm) on the gate electrode 21 side from the reference, and in the range of 0.15 micrometers on the depth side of the well region 24 from this reference. For instance, the impurity concentration distribution profile has a peak of the impurity concentration distribution in the range of ±0.15 micrometers with reference to the dashed line 70.

In FIG. 2A, the field effect transistor 20n is shown in enlarged view. However, the impurity concentration distribution profile in the depth direction of the well region 34 immediately below the gate electrode 31 of the field effect transistor 30p is also similar to the configuration in FIG. 2B.

That is, in the semiconductor device 1, the impurity concentration profile in the depth direction immediately below the gate electrode 21 has a peak of the impurity concentration profile in a prescribed range above and below the reference at the position of the dashed line 70, 71. For instance, the impurity concentration profile in the depth direction immediately below the gate electrode 21 has a peak of the impurity concentration profile in the range of 0.15 micrometers on the gate electrode 21 side and in the range of 0.15 micrometers on the depth side of the well region 24 with reference to the dashed line 70, 71.

In the semiconductor device having such an impurity concentration profile, punch-through of the field effect transistor 20n, 30p is suppressed, and leakage current during turn-off of the field effect transistor 20n, 30p is suppressed. The reason for this will be described with reference to simulation results after describing the process for manufacturing the semiconductor device 1.

Furthermore, in the semiconductor device 1, as shown in FIG. 1, an interlayer insulating film 50 is formed on the surface of the semiconductor layer 10. The interlayer insulating film 50 is selectively opened. A source electrode 51 as a first main electrode in continuity with the source region 28, a drain electrode 52 as a second main electrode in continuity with the drain region 29, and a gate wiring 53 in continuity with the gate electrode 21 are formed. In the region 30, a source electrode 54 in continuity with the source region 38, a drain electrode 55 in continuity with the drain region 39, and a gate wiring 56 in continuity with the gate electrode 31 are formed. Furthermore, a protective film 60 is formed above the interlayer insulating film 50.

Next, a method for manufacturing the semiconductor device 1 is described.

Figure 3A:
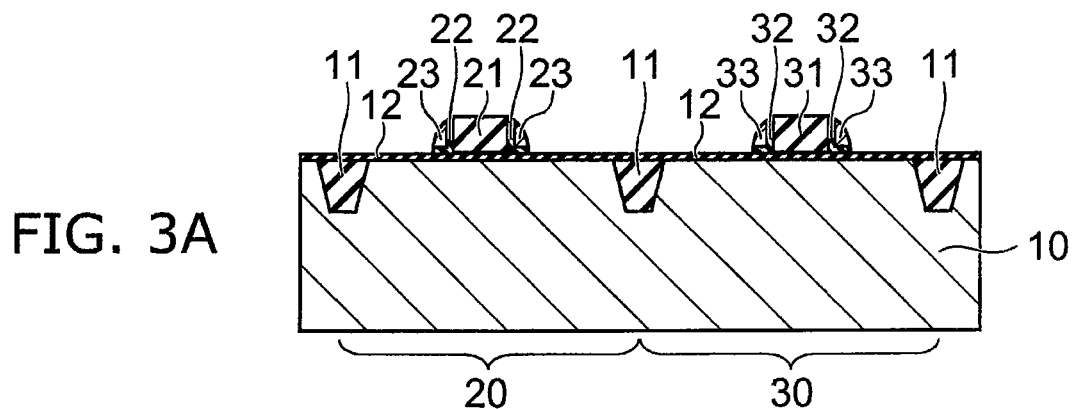
FIGS. 3A to 3C are sectional schematic views of the relevant part in a process for manufacturing a semiconductor device according to an embodiment.
Figure 3B:
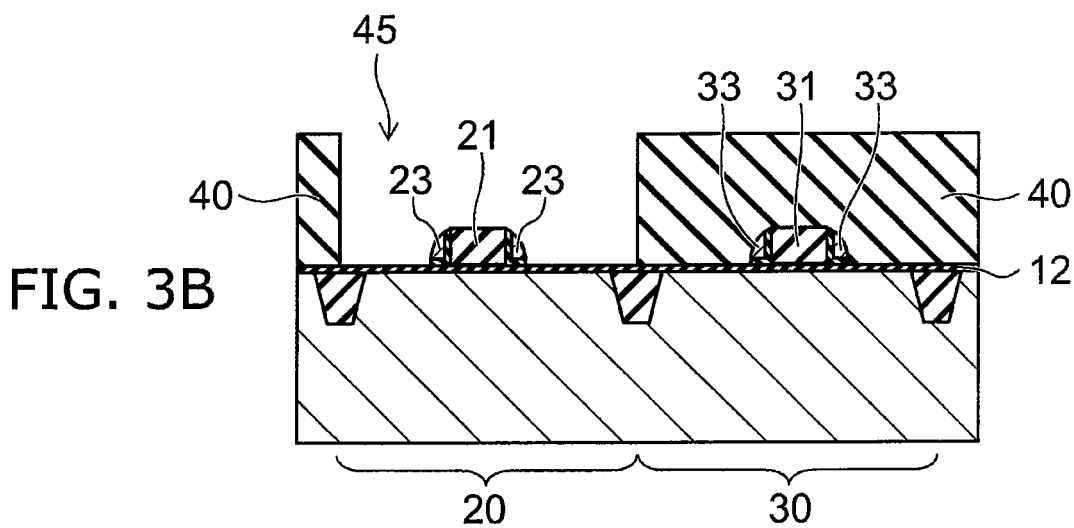
Figure 3C:
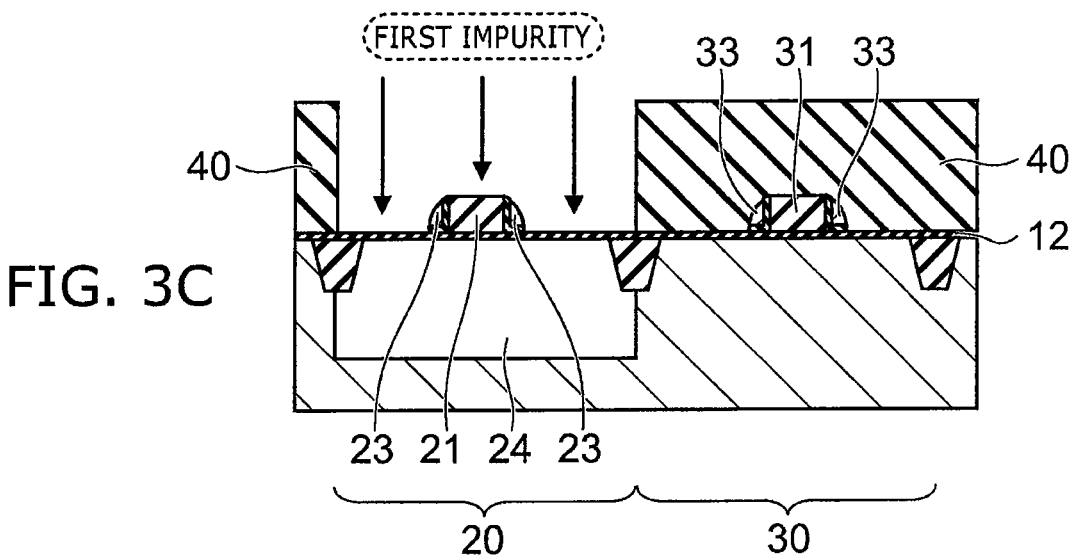

FIGS. 3A to 3C are sectional views of the relevant part in the process for manufacturing a semiconductor device according to this embodiment. More specifically, FIG. 3A is a sectional view of the relevant part in the process for manufacturing a device isolation layer, a gate oxide film, a gate electrode, and a sidewall protective film. FIG. 3B is a sectional view of the relevant part in the process for manufacturing a resist pattern (mask pattern). FIG. 3C is a sectional view of the relevant part in the process for manufacturing a p-type well region.

As shown in FIG. 3A, a device isolation layer 1, for instance, is formed in a semiconductor layer 10 primarily composed of silicon (Si). The device isolation layer 1 is e.g. STI (shallow trench isolation) or LOCOS (local oxidation of silicon). STI is formed by e.g. the burying process. LOCOS is formed by e.g. thermal oxidation. The device isolation layer 1 is primarily composed of e.g. silicon oxide ($SiO_2$). The device isolation layer 1 thus formed separates the semiconductor layer 10 into a region 20 for forming an n-channel type field effect transistor 20n and a region 30 for forming a P-channel type field effect transistor 30p.

Subsequently, a gate oxide film 12 is formed above the semiconductor layer 10 and above the device isolation layer 1. The gate oxide film 12 is formed by e.g. thermal oxidation or low pressure CVD. The material of the gate oxide film 12 is e.g. silicon oxide ($SiO_2$), silicon oxynitride (SiON), or tantalum oxide ($Ta_2O_5$).

Subsequently, a columnar gate electrode 21 is selectively formed above the gate oxide film 12 in the region 20. A columnar gate electrode 31 is selectively formed above the gate oxide film 12 in the region 30. The material of the gate electrode 21, 31 is e.g. polysilicon. Subsequently, a sidewall protective film 23 is formed on the sidewall of the gate electrode 21 via an oxide film 22 made of e.g. silicon oxide ($SiO_2$). A sidewall protective film 33 is formed on the sidewall of the gate electrode 31 via an oxide film 32 made of e.g. silicon oxide ($SiO_2$). The material of the sidewall protective film 23, 33 is e.g. silicon nitride ($Si_3N_4$).

Next, as shown in FIG. 3B, a mask pattern is formed to expose the surface of the semiconductor layer 10 where the gate electrode 21 and the sidewall protective film 23 are formed. For instance, a resist 40 is formed, and by photolithography, the region 20 for forming an n-channel type field effect transistor is exposed by an opening 45 of the resist 40. The gate oxide film 12, the gate electrode 31, the oxide film 32, and the sidewall protective film 33 in the region 30 are covered with the resist 40. Then, a first to fourth impurity for forming the field effect transistor 20n are consecutively implanted into the semiconductor layer 10 in the region 20 exposed through the resist 40.

For instance, as shown in FIG. 3C, by ion implantation, as a first impurity, a group III element such as boron (B) is implanted into the semiconductor layer 10. For instance, by ion implantation, the group III element is implanted through the gate electrode 21 and the sidewall protective film 23 into the semiconductor layer 10 below the gate electrode 21. Thus, in the region 20, for instance, a well region 24 containing the first impurity is formed. With regard to the condition for ion implantation, the acceleration energy is 100 keV or more, and the dose amount is $1.0\times10^{13}/cm^2$ or more. The incident angle of ion implantation is perpendicular to the major surface of the semiconductor layer 10. The ion implantation is performed at least once.

FIGS. 4A to 4C are sectional views of the relevant part in the process for manufacturing a semiconductor device according to this embodiment. More specifically, FIG. 4A is a sectional view of the relevant part in the process for manufacturing an implant region for adjusting the threshold voltage. FIG. 4B is a sectional view of the relevant part in the process for manufacturing lightly doped regions. FIG. 4C is a sectional view of the relevant part in the process for manufacturing a source region and a drain region.

As shown in FIG. 4A, by ion implantation, as a second impurity, a group III element such as boron (B) is implanted through the gate electrode 21 and the sidewall protective film 23 into the well region 24. Thus, in the upper portion of the well region 24, an implant region 25 containing the second impurity is formed. With regard to the condition for ion implantation, the acceleration energy is 10 keV or more, the dose amount is $1.0\times10^{12}/cm^2$ or more, and the incident angle is 7 degrees. The ion implantation is performed at least once.

Next, as shown in FIG. 4B, by ion implantation, as a third impurity, a group V element such as phosphorus (P) or arsenic (As) is implanted into the well region 24. Thus, in the surface of the well region 24 on both sides of the gate electrode 21, for instance, lightly doped regions 26, 27 containing the third impurity are selectively formed. With regard to the condition for ion implantation, the acceleration energy is 20 keV or more, the dose amount is $1.0\times10^{13}/cm^2$ or more, and the incident angle is 15 degrees or more. The ion implantation in this step is performed, for instance, in four-way rotation. That is, ions are implanted into the well region 24 in the directions from the left, right, front, and rear side in the figure. The ion implantation from each direction is performed at least once.

Next, as shown in FIG. 4C, by ion implantation, as a fourth impurity, a group V element such as phosphorus (P) or arsenic (As) is implanted into the semiconductor layer 10. Thus, in the surface of the well region 24 on both sides of the gate electrode 21, for instance, a source region 28 and a drain region 29 containing the fourth impurity are selectively formed. With regard to the condition for ion implantation, the acceleration energy is 5 keV or more, the dose amount is $1.0 \times 10^{13}/cm^2$ or more, and the incident angle is 7 degrees. Furthermore, the aforementioned four-way rotation is performed. The ion implantation from each direction is performed at least once.

By such a manufacturing process, a field effect transistor 20n is formed in the surface of the semiconductor layer 10 in the region 20. Subsequently, the resist 40 is removed.

Figure 5A:
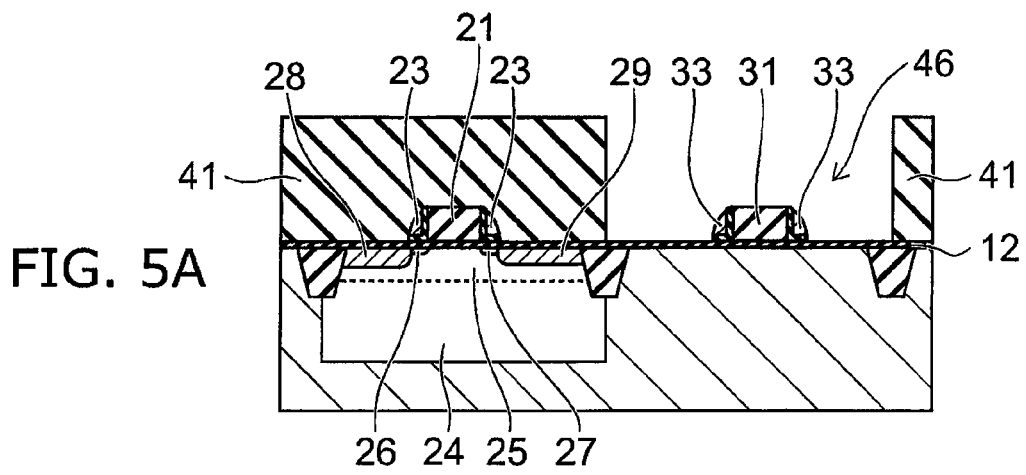
FIGS. 5A to 5C are sectional schematic views of the relevant part in the process for manufacturing a semiconductor device according to this embodiment.
Figure 5B:
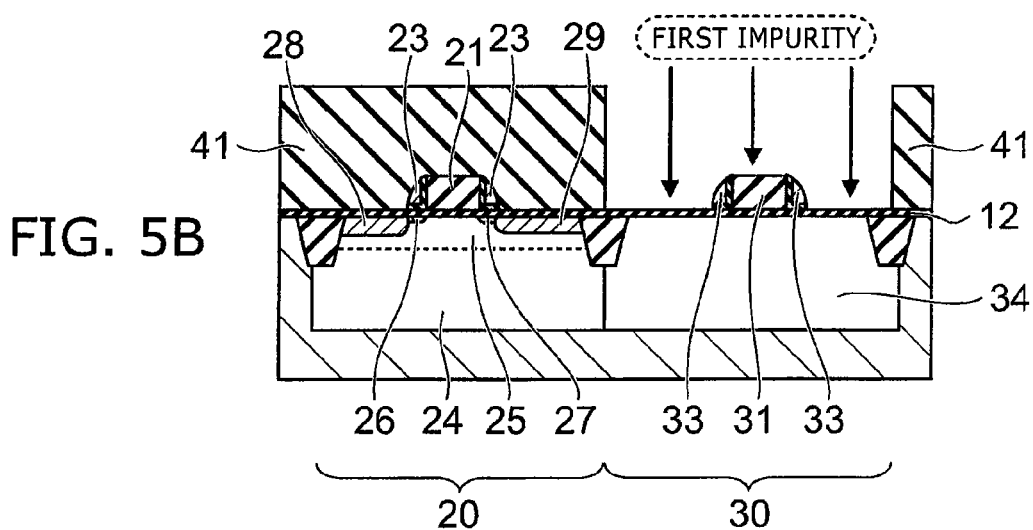
Figure 5C:
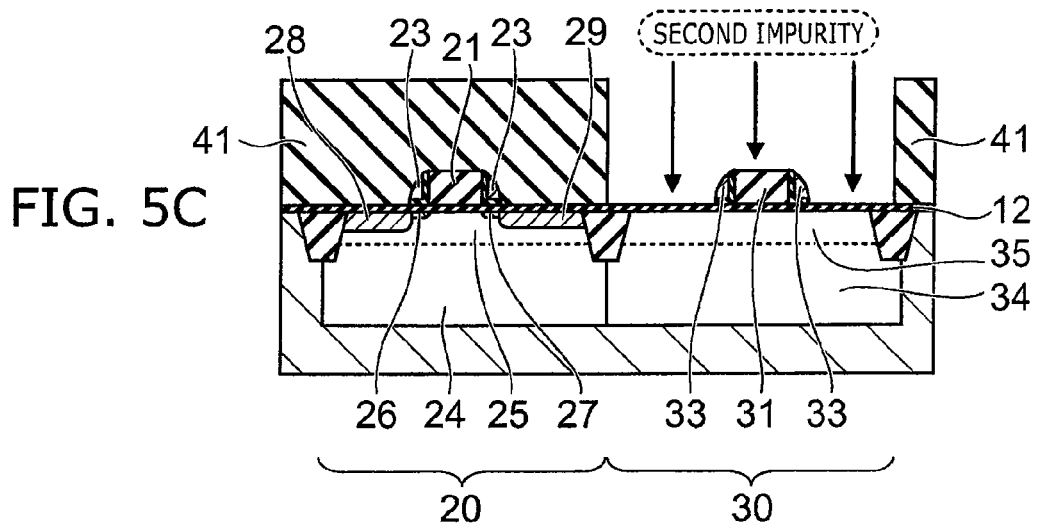

FIGS. 5A to 5C are sectional views of the relevant part in the process for manufacturing a semiconductor device according to this embodiment. More specifically, FIG. 5A is a sectional view of the relevant part in the process for manufacturing a resist pattern (mask pattern). FIG. 5B is a sectional view of the relevant part in the process for manufacturing an n-type well region. FIG. 5C is a sectional view of the relevant part in the process for manufacturing an implant region for adjusting the threshold voltage.

Next, as shown in FIG. 5A, a mask pattern is again formed above the semiconductor layer 10. For instance, a resist 41 is formed, and by photolithography, the region 30 for forming a p-channel type field effect transistor is exposed by an opening 46. The gate oxide film 12, the gate electrode 21, the oxide film 22, and the sidewall protective film 23 in the region 20 are covered with the resist 41. Then, a first to fourth impurity for forming the field effect transistor 30p are consecutively implanted into the semiconductor layer 10 in the region 30 exposed through the resist 41.

For instance, as shown in FIG. 5B, by ion implantation, as a first impurity, a group V element such as phosphorus (P) or arsenic (As) is implanted into the semiconductor layer 10. The group V element is implanted through the gate electrode 31 into the semiconductor layer 10. Thus, in the region 30, a well region 34 containing the first impurity is formed. With regard to the condition for ion implantation, the acceleration energy is 200 keV or more, and the dose amount is $1.0 \times 10^{13}/cm^2$ or more. The incident angle of ion implantation is perpendicular to the major surface of the semiconductor layer 10. The ion implantation is performed at least once.

Next, as shown in FIG. 5C, by ion implantation, as a second impurity, a group V element such as phosphorus (P) or arsenic (As) is implanted through the gate electrode 31 into the well region 34. Thus, in the upper portion of the well region 34, an implant region 35 containing the second impurity is formed. With regard to the condition for ion implantation, the acceleration energy is 50 keV or more, the dose amount is $1.0 \times 10^{12}/cm^2$ or more, and the incident angle is 7 degrees. The ion implantation is performed at least once.

FIGS. 6A to 6C are sectional views of the relevant part in the process for manufacturing a semiconductor device according to this embodiment. More specifically, FIG. 6A is a sectional view of the relevant part in the process for manufacturing lightly doped regions. FIG. 6B is a sectional view of the relevant part in the process for manufacturing a source region and a drain region. FIG. 6C is a sectional view of the relevant part in the process for manufacturing an interlayer insulating film, a source electrode, a drain electrode, a gate wiring, and a protective film.

As shown in FIG. 6A, by ion implantation, as a third impurity, a group III element such as boron (B) is implanted into the well region 34. Thus, in the surface of the well region 34 on both sides of the gate electrode 31, lightly doped regions 36, 37 containing the third impurity are selectively formed. With regard to the condition for ion implantation, the acceleration energy is 10 keV or more, the dose amount is $1.0 \times 10^{13}/cm^2$ or more, and the incident angle is 15 degrees or more. The ion implantation in this step is performed, for instance, in four-way rotation. That is, ions are implanted into the well region 34 in the directions from the left, right, front, and rear side in the figure. The ion implantation from each direction is performed at least once.

Next, as shown in FIG. 6B, by ion implantation, as a fourth impurity, a group III element such as boron (B) is implanted into the well region 34. Thus, in the surface of the well region 34 on both sides of the gate electrode 31, a source region 38 and a drain region 39 containing the fourth impurity are selectively formed. With regard to the condition for ion implantation, the acceleration energy is 5 keV or more, the dose amount is $1.0 \times 10^{15}/cm^2$ or more, and the incident angle is 7 degrees. Furthermore, the aforementioned four-way rotation is performed. The ion implantation from each direction is performed at least once.

By such a manufacturing process, a field effect transistor 30p is formed in the surface of the semiconductor layer 10 in the region 30. Subsequently, the resist 41 is removed.

Thus, in the method for manufacturing a semiconductor device according to this embodiment, the region 20 of the semiconductor layer 10 for forming an N-channel type field effect transistor is exposed through the resist 40 by only one step of photolithography. Then, in the exposed region 20, by ion implantation, the step of forming a well region 24, the step of forming an implant region 25, the step of forming lightly doped regions 26, 27, and the step of forming a source region 28 and a drain region 29 are consecutively performed.

Furthermore, the region 30 of the semiconductor layer 10 for forming a p-channel type field effect transistor is exposed through the resist 41 by only one step of photolithography. Then, in the exposed region 30, by ion implantation, the step of forming a well region 34, the step of forming an implant region 35, the step of forming lightly doped regions 36, 37, and the step of forming a source region 38 and a drain region 39 are consecutively performed.

After these steps, annealing treatment is collectively performed to activate the impurities.

Next, as shown in FIG. 6C, an interlayer insulating film 50 is formed on the surface of the semiconductor layer 10. Subsequently, the interlayer insulating film 50 is selectively opened by anisotropic etching. A source electrode 51 in continuity with the source region 28 of the region 20, a drain electrode 52 in continuity with the drain region 29, a gate wiring 53 in continuity with the gate electrode 21, a source electrode 54 in continuity with the source region 38 of the region 30, a drain electrode 55 in continuity with the drain region 39, and a gate wiring 56 in continuity with the gate electrode 31 are formed. Furthermore, a protective film 60 is formed above the interlayer insulating film 50. Thus, the semiconductor device 1 shown in FIG. 1 is formed.

The effect of the invention according to this embodiment is illustrated with reference to simulation results. By way of example, the simulation calculation is performed for the region 20 including the field effect transistor 20n.

FIGS. 7A and 7B illustrate the process flow of the method for manufacturing a semiconductor device subjected to simulation calculation. More specifically, FIG. 7A illustrates the process flow of the method for manufacturing a semiconductor device according to a comparative example. FIG. 7B illustrates the process flow of the method for manufacturing a semiconductor device according to this embodiment.

As shown in FIG. 7A, in the process flow of the method for manufacturing a semiconductor device according to the comparative example, first, a well region 24 is formed in the semiconductor layer 10 by ion implantation (S100), an implant region 25 is formed by ion implantation (S101), and annealing treatment by RTA (rapid thermal annealing) is performed (S102). Subsequently, a gate oxide film 12 is formed (S103), a gate electrode 21 is formed (S104), and an oxide film 22 by RTO (rapid thermal oxidation) is formed (S105). That is, in the comparative example, after the well region 24 and the implant region 25 are formed, the gate electrode 21 is formed.

Subsequently, lightly doped regions 26, 27 are formed by ion implantation (S106), a sidewall protective film 23 on the gate electrode 21 is formed (S107), and annealing treatment by RTA is performed (S108). Furthermore, a source region 28 and a drain region 29 are formed by ion implantation (S109), and annealing treatment by RTA is performed (S110).

In this process, photolithography may be performed in each of the step of forming a well region 24, the step of forming a gate electrode 21 (S104), the step of forming lightly doped regions 26, 27 (S106), and the step of forming a source region 28 and a drain region 29 (S109). Thus, photolithography and heat treatment may be performed a plurality of times from the step of forming a well region 24 until the step of forming a source region 28 and a drain region 29.

In contrast, in the method for manufacturing a semiconductor device according to this embodiment, as shown in FIG. 7B, first, a gate oxide film 12 is formed above the semiconductor layer 10 (S10), and a gate electrode 21 is formed (S11). In the step of forming a gate electrode 21 (S11), photolithography is used. Subsequently, an oxide film 22 by RTO is formed (S12). Subsequently, a sidewall protective film 23 on the gate electrode 21 is formed (S13), and annealing treatment by RTA is performed (S14). Subsequently, the region 20 is exposed by photolithography. A well region 24 is formed by ion implantation (S15), an implant region 25 is formed by ion implantation (S16), lightly doped regions 26, 27 are formed by ion implantation (S17), and a source region 28 and a drain region 29 are formed by ion implantation (S18). Finally, annealing treatment by RTA is collectively performed (S19).

That is, in this embodiment, after the region 20 is exposed through the resist 40 by photolithography, ion implantation is performed on the semiconductor layer 10 to consecutively form a well region 24, an implant region 25, lightly doped regions 26, 27, a source region 28, and a drain region 29. Subsequently, heat treatment is collectively performed. For instance, photolithography is performed only once before forming a well region 24, and heat treatment is performed only once after forming a source region 28 and a drain region 29. The step of forming a well region 24, the step of forming an implant region 25, the step of forming lightly doped regions 26, 27, and the step of forming a source region 28 and a drain region 29 are consecutively performed by ion implantation. Hence, photolithography and heat treatment are not performed from the step of forming a well region 24 until the step of forming a source region 28 and a drain region 29.

Figures 8A, 8B:
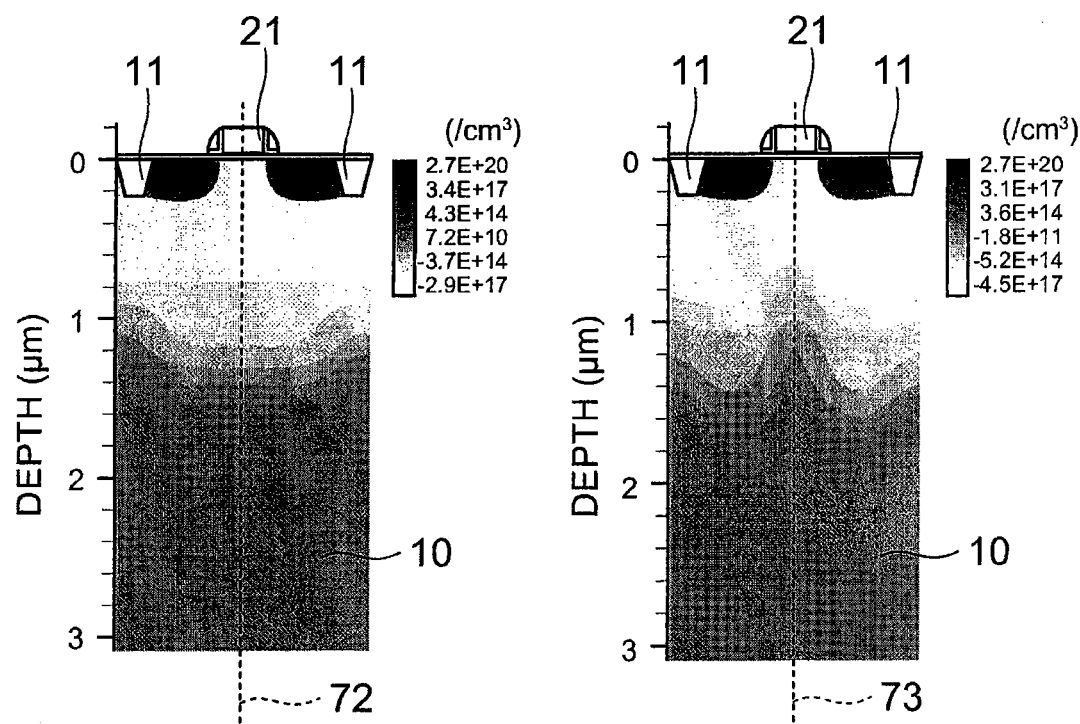
FIGS. 8A and 8B illustrate the impurity concentration distribution of the semiconductor device.

FIGS. 8A and 8B illustrate the impurity concentration distribution of the semiconductor device. More specifically, FIG. 8A illustrates the distribution of impurity concentration in the semiconductor device according to the comparative example. FIG. 8B illustrates the distribution of impurity concentration in the semiconductor device according to this embodiment. In FIGS. 8A and 8B, the N-type impurity concentration is represented by positive values, and the p-type impurity concentration is represented by negative values. Furthermore, FIGS. 8A and 8B show the line 72, 73 drawn from the center of the gate electrode 21 to the lower side of the well region 24.

In the distribution of impurity concentration in the semiconductor device according to the comparative example shown in FIG. 8A, the impurity concentration increases toward the surface of the portion corresponding to the source region 28 and the drain region 29. Furthermore, the impurity concentration gradually decreases from the implant region 25 toward the well region 24.

Also in the distribution of impurity concentration in the semiconductor device according to this embodiment shown in FIG. 8B, the impurity concentration increases toward the surface of the portion corresponding to the source region 28 and the drain region 29, and the impurity concentration gradually decreases from the implant region 25 toward the well region 24. However, toward the lower side of the semiconductor layer 10, the impurity concentration immediately below the gate electrode 21 tends to be lower than that in the semiconductor device according to the comparative example. The reason for this is considered as follows. In this embodiment, when the well region 24 and the implant region 25 are formed, ion implantation is performed through the gate electrode 21. Hence, it is considered that the masking effect due to the gate electrode 21 contributes to the impurity concentration.

However, even in this distribution, the impurity concentration profile on the line 73 has a sharper peak immediately below the gate electrode 21 than the impurity concentration profile on the line 72.

Figure 9A:
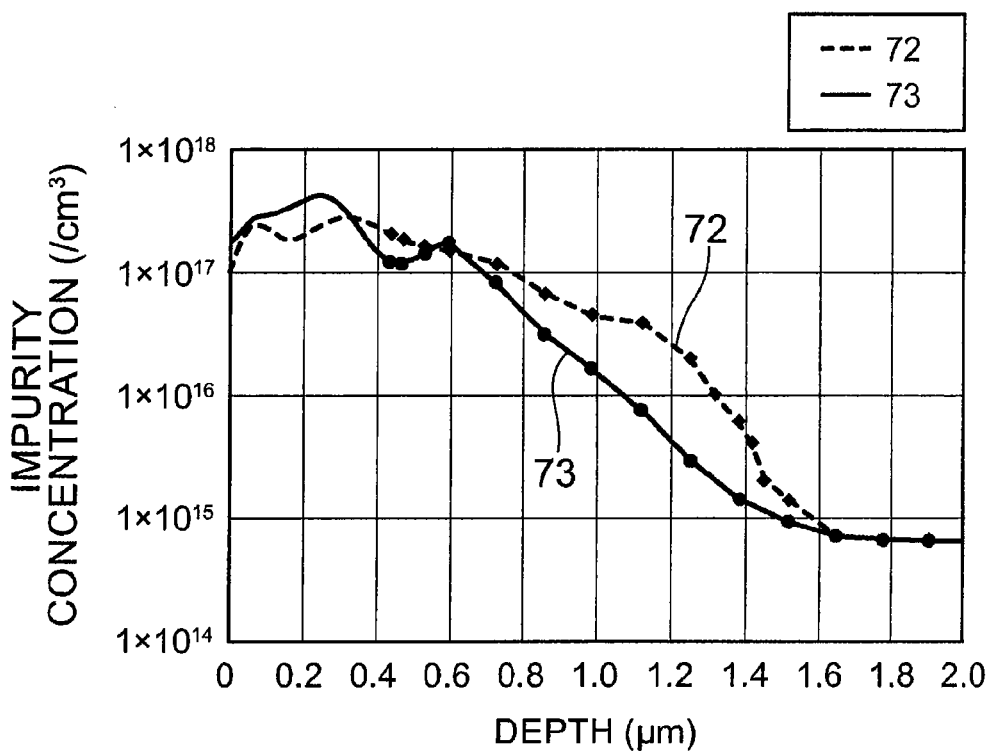
FIGS. 9A and 9B illustrate impurity concentration profiles in the depth direction immediately below the gate electrode and leakage current characteristics during turn-off of the field effect transistor.
Figure 9B:
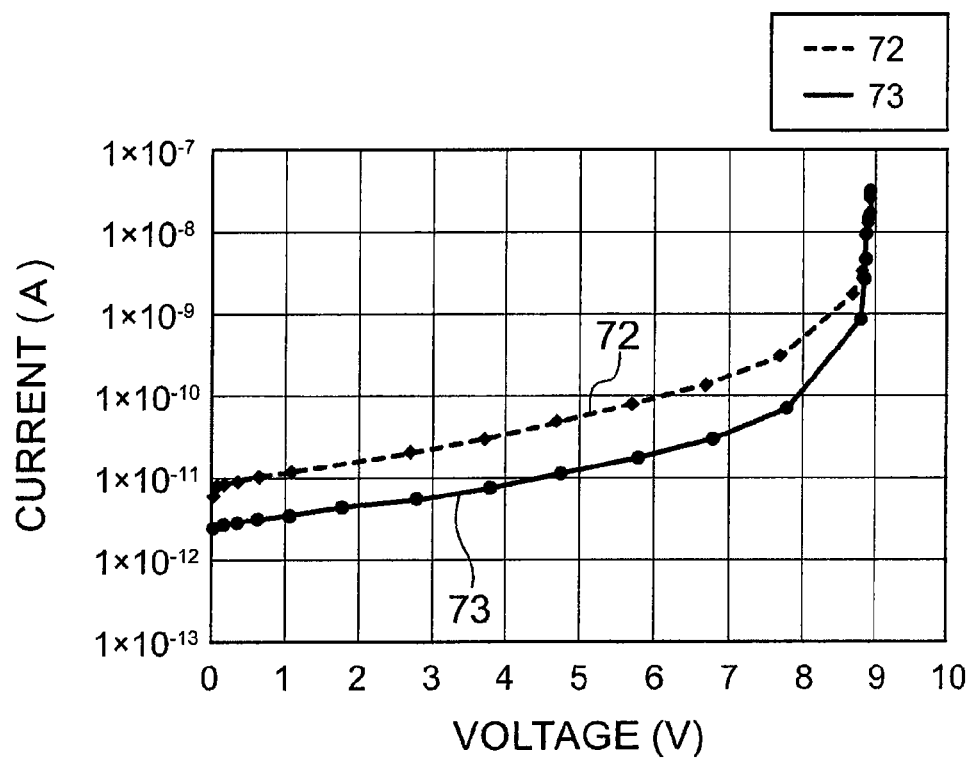

FIGS. 9A and 9B illustrate impurity concentration profiles in the depth direction immediately below the gate electrode and leakage current characteristics during turn-off of the field effect transistor. That is, FIG. 9A illustrates impurity concentration profiles in the depth direction immediately below the gate electrode, and FIG. 9B illustrates leakage current characteristics during turn-off of the field effect transistor.

In FIG. 9A, the horizontal axis represents the depth ($\mu$m) from immediately below the gate electrode 21, and the vertical axis represents the impurity concentration (/cm$^3$). In FIG. 9B, the horizontal axis represents the voltage (V) applied between the source region and the drain region during turn-off, and the vertical axis represents the current value (A) during turn-off.

First, FIG. 9A is described.

FIG. 9A shows the impurity concentration profile on the line 72 of FIG. 8A according to the comparative example, and the impurity concentration profile on the line 73 of FIG. 8B according to this embodiment. The impurity concentration profile is a concentration profile in which the concentration of a total impurity including the first impurity and the second impurity injected into the semiconductor layer 10 in the region 20.

The impurity concentration profile on the line 72 is generally broader than the impurity concentration profile on the line 73. The reason for this is as follows. In the manufacturing process of the comparative example, a plurality of photolithography steps and a plurality of heat treatment steps are performed from the step of forming a well region 24 until the step of forming a source region 28 and a drain region 29. Hence, impurities diffuse more easily in the semiconductor layer 10 than in the manufacturing process according to this embodiment. That is, in the manufacturing process of the comparative example, it is difficult to control the impurity concentration profile to a prescribed shape.

In contrast, the impurity concentration profile on the line 73 has a portion with a distinctly high impurity concentration in the depth range of 0.1-0.3 μm immediately below the gate electrode 21.

Furthermore, the peak position of this portion can be shifted to the right or left side in FIG. 9A by appropriately adjusting the ion implantation condition from the step of forming a well region 24 until the step of forming a source region 28 and a drain region 29. In other words, by changing the ion implantation condition, the peak of the impurity concentration profile can be attracted toward the gate electrode 21, or separated away from the gate electrode 21 in the depth direction of the semiconductor layer 10. If such a peak of the impurity concentration profile is located immediately below the gate electrode 21, the leakage current characteristic during turn-off of the field effect transistor 20n is suppressed as shown in FIG. 9B.

As shown in FIG. 9B, the leakage current (line 73) of the semiconductor device according to this embodiment is lower than the leakage current (line 72) of the semiconductor device of the comparative example. For instance, in the voltage range of 0-8 V, the leakage current value of the semiconductor device of this embodiment is decreased to approximately ⅕ of the leakage current value of the semiconductor device of the comparative example.

The reason for this is described by referring again to the enlarged view of the field effect transistor 20n in FIGS. 2A and 2B.

The potential of the gate electrode 21 of the field effect transistor 20n is made lower than the threshold. Then, if a voltage is applied between the source region 28 and the drain region 29, the electric field concentrates on the position A of the source region 28 having the maximum curvature and the position B of the drain region 29 having the maximum curvature. Thus, the electric field intensity at the positions A, B is maximized.

Here, as in the comparative example, if the impurity concentration near the dashed line 70 decreases, the depletion layers extending from the source region and the drain region are more likely to be brought into contact with each other during turn-off of the field effect transistor 20n. If the depletion layers are brought into contact with each other, then punch-through, i.e., current flow between the source region and the drain region even during turn-off, is more likely to occur. Consequently, leakage current during turn-off increases. The current path in the case of punch-through is formed near the dashed line 70 connecting between the positions A and B.

However, in the semiconductor device 1 according to this embodiment, the peak of the impurity concentration profile is placed near the dashed line 70. For instance, the first and second impurity element are injected so that the peak of the concentration distribution profile of the impurity element in the depth direction of the well region 24 exists in the range of ±0.15 μm with reference to the position of the well region 24 at the identical depth to the portion A or the portion B. Thus, with reference to the dashed line 70, the peak of the impurity concentration profile exists in the range of 0.15 μm on the gate electrode 21 side and in the range of 0.15 μm on the semiconductor layer 10 side.

In such a structure, the impurity concentration near the dashed line 70 does not decrease, making the punch-through phenomenon less likely to occur. Consequently, leakage current during turn-off of the field effect transistor 20n is suppressed, and the power consumption of the semiconductor device 1 is reduced. Furthermore, because leakage current during turn-off is suppressed, the channel length of the field effect transistor can be further reduced. This enhances the design flexibility of the semiconductor device.

Here, if the peak of the impurity concentration profile is placed beyond 0.15 μm on the gate electrode 21, 31 side from the dashed line 70, the impurity concentration immediately below the gate oxide film 12 is made too high. Thus, in the field effect transistor 20n, the inversion layer is difficult to form. Furthermore, if the peak of the impurity concentration profile is placed beyond 0.15 μm on the implant region 25 side from the dashed line 70, the impurity concentration near the dashed line 70 decreases, making punch-through more likely to occur. Thus, leakage current during turn-off of the field effect transistor 20n increases. Hence, it is preferable that with reference to the dashed line 70, the peak of the impurity concentration profile exist in the range of 0.15 μm on the gate electrode 21 side and in the range of 0.15 μm on the semiconductor layer 10 side.

In contrast to the manufacturing process of the comparative example, in the manufacturing process according to this embodiment, each of the regions 20 and 30 is exposed by only one step of photolithography, and a well region, an implant region for adjusting the threshold voltage, lightly doped regions, a source region, and a drain region are consecutively formed by ion implantation. Consequently, the number of photolithography steps and the number of heat treatment steps are made lower than those in the manufacturing process of the comparative example, and the manufacturing cost can be further reduced.

The embodiment of the invention has been described above with reference to examples. However, the invention is not limited to these examples. That is, those skilled in the art can suitably modify these examples, and such modifications are also encompassed within the scope of the invention as long as they fall within the spirit of the invention. For instance, the components of the above examples and their layout, material, condition, shape, size and the like are not limited to those illustrated above, but can be suitably modified.

Furthermore, the components of the above embodiment can be combined with each other as long as technically feasible. Such combinations are also encompassed within the scope of the invention as long as they fall within the spirit of the invention.

Furthermore, those skilled in the art can conceive various modifications and variations within the spirit of the invention. It is understood that such modifications and variations are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A field effect type semiconductor device comprising:
   a well region of a second conductivity type with a source region of a first conductivity type and a drain region of the first conductivity type selectively formed in a surface of the well region;
   a control electrode configured to control a current path between the source region and the drain region;
   a first main electrode connected to the source region; and
   a second main electrode connected to the drain region, with respect to a reference defined as a position of the well region at an identical depth to a portion of the source region with maximum curvature or a portion of the drain region with maximum curvature, a profile of impurity concentration distribution of an impurity of the second conductivity type along a depth direction of the well region below the control electrode and between the source region and the drain region having a peak impurity concentration located within a range of depth positions of the well region extending from 0.15 micrometers above the reference to 0.15 micrometers below the reference.

2. The device according to claim 1, wherein in the depth direction of the well region, the peak impurity concentration is located within a range of depth positions of the well region extending from 0.15 micrometers above a line connecting the portion of the source region with maximum curvature and the portion of the drain region with maximum curvature to 0.15 micrometers below the line.

3. The device according to claim 1, wherein the reference is located at a depth of 0.1 micrometers or more and 0.3 micrometers or less from an interface between an oxide film provided below the control electrode and an implant region provided in the surface of the well region.

4. A field effect type semiconductor device comprising:
a first semiconductor element including:
  a first well region of a second conductivity type with a first source region of a first conductivity type and a first drain region of the first conductivity type selectively formed in a surface of the first well region;
  a first control electrode configured to control a current path between the first source region and the first drain region;
  a first main electrode connected to the first source region; and
  a second main electrode connected to the first drain region; and
a second semiconductor element including:
  a second well region of the first conductivity type with a second source region of the second conductivity type and a second drain region of the second conductivity type selectively formed in a surface of the second well region;
  a second control electrode configured to control a current path between the second source region and the second drain region;
  a third main electrode connected to the second source region; and
  a fourth main electrode connected to the second drain region,
with respect to a first reference defined as a position of the first well region at an identical depth to a portion of the first source region with maximum curvature or a portion of the first drain region with maximum curvature, a first profile of impurity concentration distribution of an impurity of the second conductivity type along a depth direction of the first well region below the first control electrode and between the first source region and the first drain region having a peak impurity concentration located within a range of depth positions of the first well region extending from 0.15 micrometers above the first reference to 0.15 micrometers below the first reference,
with respect to a second reference defined as a position of the second well region at an identical depth to a portion of the second source region with maximum curvature or a portion of the second drain region with maximum curvature, a second profile of impurity concentration distribution of an impurity of the first conductivity type along a depth direction of the second well region below the second control electrode and between the second source region and the second drain region having a peak impurity concentration located within a range of depth positions of the second well region extending from 0.15 micrometers above the second reference to 0.15 micrometers below the second reference.

5. The device according to claim 4, wherein
in the depth direction of the first well region, the peak impurity concentration of the second conductivity type is located within a range of depth positions of the first well region extending from 0.15 micrometers above a first line between the portion of the first source region with maximum curvature and the portion of the first drain region with maximum curvature to 0.15 micrometers below the first line, and
in the depth direction of the second well region, the peak impurity concentration of the first conductivity type is located within a range of depth positions of the second well region extending from 0.15 micrometers above a second line between the portion of the second source region with maximum curvature and the portion of the second drain region with maximum curvature to 0.15 micrometers below the second line.

6. The device according to claim 4, wherein
the first reference is located at a depth of 0.1 micrometers or more and 0.3 micrometers or less from an interface between an oxide film provided below the first control electrode and an implant region provided in the surface of the first well region, and
the second reference is located at a depth of 0.1 micrometers or more and 0.3 micrometers or less from an interface between an oxide film provided below the second control electrode and an implant region provided in the surface of the second well region.

7. A method for manufacturing a field effect type semiconductor device, comprising:
forming a control electrode and a sidewall protective film adjacent to a sidewall of the control electrode above a semiconductor layer;
forming a mask pattern having an opening exposing the control electrode and the sidewall protective film;
forming a well region containing a first impurity element in the semiconductor layer including below the control electrode by injecting the first impurity element into the semiconductor layer;
forming an implant region containing a second impurity element in the well region by injecting the second impurity element into the well region, the implant region being configured to adjust a threshold voltage;
forming a first lightly doped region containing a third impurity element and a second lightly doped region containing the third impurity element in a portion of a surface of the well region below the sidewall protective film by injecting the third impurity element into the surface of the well region; and
selectively forming a source region containing a fourth impurity element and a drain region containing the fourth impurity element in a portion of the surface of the well region outside the control electrode and the sidewall protective film by injecting the fourth impurity element into the surface of the well region,
with respect to a reference defined as a position of the well region at an identical depth to a portion of the source region with maximum curvature or a portion of the drain region with maximum curvature, the first and the second impurity element being injected so that a peak of a concentration distribution profile of the first and the second impurity element along a depth direction of the well region below the control electrode and between the source region and the drain region being located within a range of depth positions of the well region extending from 0.15 micrometers above the reference to 0.15 micrometers below the reference, with respect to a reference defined as a position of the well region at an identical depth to a portion of the source region with maximum curvature or a portion of the drain region with maximum curvature, a profile of impurity concentration distribution of an impurity of the second conductivity type along a depth direction of the well region below the control electrode and between the source region and the drain region having a peak impurity concentration located within a range of depth positions of the well region extending from 0.15 micrometers above the reference to 0.15 micrometers below the reference.

8. The method according to claim 7, wherein in the depth direction of the well region, the peak impurity concentration is located within a range of depth positions of the well region extending from 0.15 micrometers above a line between the portion of the source region with maximum curvature and the portion of the drain region with maximum curvature to 0.15 micrometers below the line.

9. The method according to claim 7, wherein the reference is located at a depth of 0.1 micrometers or more and 0.3 micrometers or less from a surface of the implant region.

10. The method according to claim 7, wherein after the mask pattern is formed, forming the well region, forming the implant region, selectively forming the first lightly doped region and the second lightly doped region, and forming the source region and the drain region are consecutively performed by ion implantation.

11. The method according to claim 10, wherein
no heat treatment is performed on the semiconductor layer while the forming the well region, the forming the implant region, the selectively forming the first lightly doped region and the second lightly doped region, and the forming the source region and the drain region are consecutively performed by the ion implantation, and
heat treatment is performed on the semiconductor layer after consecutive processing by the ion implantation.

12. The method according to claim 7, wherein in the forming the well region and the forming the implant region, the first and the second impurity element are injected into the semiconductor layer through the control electrode.

13. The method according to claim 7, wherein the second impurity element is one of a group III element and a group V element.

* * * * *